(12) United States Patent
Gardes

(10) Patent No.: US 6,677,657 B2
(45) Date of Patent: Jan. 13, 2004

(54) HIGH-VOLTAGE PERIPHERY

(75) Inventor: Pascal Gardes, Tours (FR)

(73) Assignee: STMicroelectronics A.A., Montrouge (FR)

( * ) Notice: Subject to any disclaimer, the term of this patent is extended or adjusted under 35 U.S.C. 154(b) by 0 days.

(21) Appl. No.: 10/255,279

(22) Filed: Sep. 26, 2002

(65) Prior Publication Data

US 2003/0057485 A1 Mar. 27, 2003

(51) Int. Cl.[7] .............................................. H01L 23/58
(52) U.S. Cl. ...................... 257/488; 257/508; 257/520
(58) Field of Search ................................ 257/488, 489, 257/503, 508, 513, 514, 515, 520

(56) References Cited

U.S. PATENT DOCUMENTS

| 5,241,210 A | * | 8/1993 | Nakagawa et al. ......... 257/487 |
| 5,640,040 A | | 6/1997 | Nakagawa et al. |
| 5,767,548 A | | 6/1998 | Wondrak et al. |
| 6,114,730 A | * | 9/2000 | Tani ............................ 257/353 |
| 6,118,152 A | | 9/2000 | Yamaguchi et al. |

OTHER PUBLICATIONS

French Search Report from French Patent Application No. 01/12383, filed Sep. 26, 2001.

* cited by examiner

*Primary Examiner*—Ngân V. Ngô
(74) *Attorney, Agent, or Firm*—Wolf, Greenfield & Sacks, P.C.; James H. Morris

(57) ABSTRACT

A method for forming a component in a portion of a semiconductor substrate on insulator delimited by a lateral wall separated by an insulating layer from a peripheral region internal to the portion and heavily doped of a same first conductivity type as the substrate. A conductive plate is formed at the same time as the wall, on a layer of protection of the substrate surface, in electric contact with the peripheral region, the plate extending above said peripheral region towards the inside of the portion with respect to the wall, beyond the location above the limit between the peripheral region and the substrate.

3 Claims, 3 Drawing Sheets

HIGH-VOLTAGE PERIPHERY

BACKGROUND OF THE INVENTION

1. Field of the Invention

The present invention generally relates to the manufacturing of discrete components in silicon wafers. More specifically, the present invention relates to the periphery of high-voltage components in silicon-on-insulator wafers.

2. Discussion of the Related Art

FIGS. 1A to 1D illustrate, in a simplified partial cross-section view, different steps of the forming of a high-voltage discrete component in a silicon-on-insulator (SOI) semiconductor substrate.

As illustrated in FIG. 1A, the process starts from a single-crystal silicon substrate 1 of a first conductivity type, for example, N. Substrate 1 includes a heavily-doped buried layer 2 of the same type N, which rests on an insulating layer 3, typically silicon oxide, supported by a lower single-crystal silicon substrate 4 of the second conductivity type, for example, P. This assembly is typically formed by pasting two silicon wafers separated by an insulator and by leveling one of the wafers. As illustrated to the right of the drawing, one or several elements of the component have for example been formed in substrate 1, such as a lightly-doped P-type well 5. The implantation of well 5 is followed by the forming, on the entire exposed surface of substrate 1, of a protection layer 6, generally silicon oxide.

As illustrated in FIG. 1B, the periphery of the discrete component is defined by a trench 7 joining insulating layer 3. Trench 7 is intended to separate, that is, to isolate, two neighboring components. As an example, trench 7 is considered to separate the considered component from an unused portion of substrate 1 (to the left of the drawing) separated from another component (not shown) by another trench (not shown). The opening of trench 7 is followed by a doping of its edges. A heavily-doped N-type region 8 in contact with buried layer 2 via a vertical region 9 along the wall of trench 7 is thus formed at the surface of substrate 1, at the component periphery. An insulating layer 10, typically thermal silicon oxide, is then formed on the walls of trench 7.

Then, as illustrated in FIG. 1C, a material is deposited to completely fill trench 7. The material is preferably an insulating or amorphous material, generally undoped polysilicon. The material then is removed outside of the trench by chem-mech polishing (CMP). A peripheral wall 12 separated from peripheral region 8 and vertical region 9 and from buried layer 2 by insulating layer 10 has thus been formed around the portion of substrate 1 in which the component is formed.

As illustrated in FIG. 1D, the structure is then coated with a layer 13 of a dielectric. The method carries on with the forming in and/or around well 5 of specifically doped regions, then of contacts between metal tracks formed on dielectric 13 and such specific regions and/or well 5 and/or substrate 1 and/or peripheral region 8 before passivating the assembly. The component thus formed may be any type of high-voltage component such as a thyristor, an NPN or PNP type bipolar transistor, or a diode. As a non-limiting example, FIG. 1D illustrates a heavily-doped P-type region 14 formed at the surface of well 5 and put in contact by a via 15 with a superposed metal track 16.

A disadvantage of this type of structure is the component breakdown voltage problems. Indeed, in the component operation, a situation may occur in which substrate 1, buried layer 2, vertical contact 9, and peripheral region 8 must altogether be maintained at a high voltage level while superposed metallization 16 is at a low biasing level. It is desired to be able to have a high potential difference between the high and low levels, for example, on the order of 600 volts. For this purpose, the component is designed with a substrate 1 having a theoretically appropriate thickness, for example, on the order of 60 µm. Further, it is known that, to reach such high voltage levels, it is desirable to increase the thickness of insulator 6–13 between metal track 16 and substrate 1 and/or to select insulators with a low dielectric permittivity.

However, such an overthickness is incompatible with usual manufacturing methods and poses many problems, especially of mechanical stress on underlying substrate 1, of forming of the openings necessary to the doping of specific regions 14, or of forming of vias 15. Materials with a low permittivity, such as polyimide, also pose manufacturing problems and impose specific precautions of use, especially of etching.

To overcome these disadvantages and be able to use a standard insulator having a standard thickness, it has been provided, as illustrated in FIG. 2, to form a metal field plate 18 in contact with peripheral region 8 and extending beyond the border between this region and substrate 1. However, the forming of such a plate imposes, from the forming of wall 12 described in relation with FIG. 1C, opening layer 6 and implementing specific steps of deposition and etching of a metal layer according to the pattern of plate 18. To enable subsequent etching of the metal layer without damaging wall 12, the deposition thereof is preceded by the deposition of an etch stop layer, not shown. Such a use of an additional metal level thus complicates the manufacturing process.

SUMMARY OF THE INVENTION

The present invention aims at providing discrete high-voltage components which overcome the preceding disadvantages.

The present invention more specifically aims at providing a structure of a field plate SOI-type component which is easy to manufacture.

To achieve these and other objects, the present invention provides a method for forming a component in a portion of a semiconductor substrate on insulator delimited by a lateral wall separated by an insulating layer from a peripheral region internal to said portion and heavily doped of a same first conductivity type as said substrate. A conductive plate is formed at the same time as said wall, on a layer of protection of the substrate surface, in electric contact with the peripheral region, said plate extending above said peripheral region towards the inside of said portion with respect to the wall beyond the location above the limit between the peripheral region and the substrate.

According to an embodiment of the present invention, the forming of the wall and of the plate in contact with the peripheral region is performed to simultaneously form an additional plate continuing the wall, independent from the plate in contact with the peripheral region and having its upper surface coplanar to that of the plate in contact with the peripheral region.

According to an embodiment of the present invention, the forming of the plate at the same time as that of the wall includes the steps of forming a trench peripheral to the substrate portion corresponding to the component, to partially expose the insulator; forming an insulating layer on the trench walls; opening the protection layer to partially expose the peripheral region; depositing a conductive material simultaneously in the trench and around it on the protection layer so that its surface is substantially planar; and etching the conductive material to form the plate in contact with the peripheral region and, in the trench, the lateral wall.

According to an embodiment of the present invention, the step of etching the conductive material is performed to form, at the same time as the plate in contact with the peripheral region, the additional plate.

According to an embodiment of the present invention, the conductive material is a doped semiconductor of the first conductivity type.

According to an embodiment of the present invention, the substrate includes a buried layer of the first conductivity type resting on the insulator, the peripheral region being put in contact with the buried layer by a vertical region.

According to an embodiment of the present invention, the method further includes, between the steps of forming the trench and the insulating layer, the step of doping the trench sides, whereby the peripheral region and the vertical region are formed simultaneously.

The present invention also provides a discrete high-voltage component formed in a portion of a semiconductor substrate on insulator delimited by a lateral wall separated by an insulating layer from a peripheral region internal to said portion and heavily doped of a same first conductivity type as said substrate. The component includes a conductive plate in electric contact with the peripheral region, the plate resting on a layer of protection of the substrate surface, and extending above said peripheral region towards the inside of said portion with respect to the wall beyond the location above the limit between the peripheral region and the substrate, said plate being formed of the same conductive material as said lateral wall.

According to an embodiment of the present invention, the component further includes an additional plate continuing the lateral wall, the additional plate being formed of the same conductive material as the wall and being distinct from the plate in contact with the peripheral region, the upper surfaces of the two plates being coplanar.

According to an embodiment of the present invention, the conductive material is a heavily-doped semiconductor of the first conductivity type.

The foregoing objects, features, and advantages of the present invention, will be discussed in detail in the following non-limiting description of specific embodiments in connection with the accompanying drawings.

DETAILED DESCRIPTION

For clarity, the same elements are designated with same references in the different drawings. Further, as usual in the representation of semiconductors, the different drawings are not to scale.

Figure 1A:
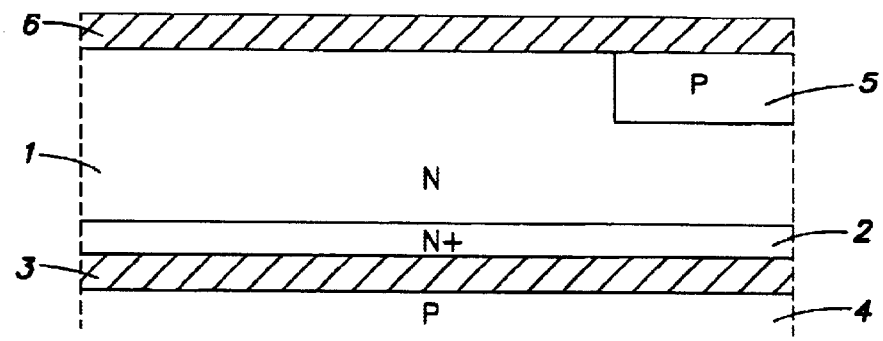
FIGS. 1A to 1D illustrate, in simplified partial cross-section views, different steps of the forming of a discrete high-voltage component according to a conventional method.
Figure 1B:
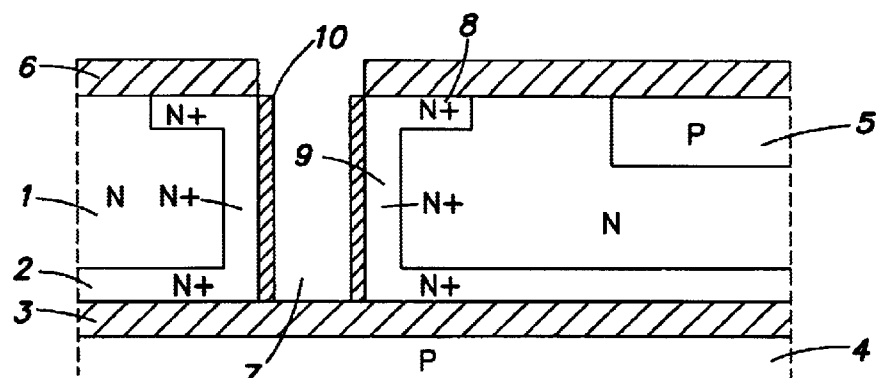
Figure 1C:
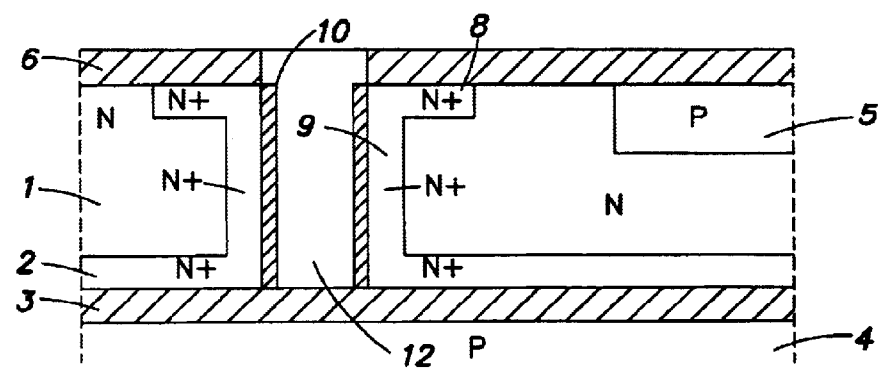
Figure 1D:
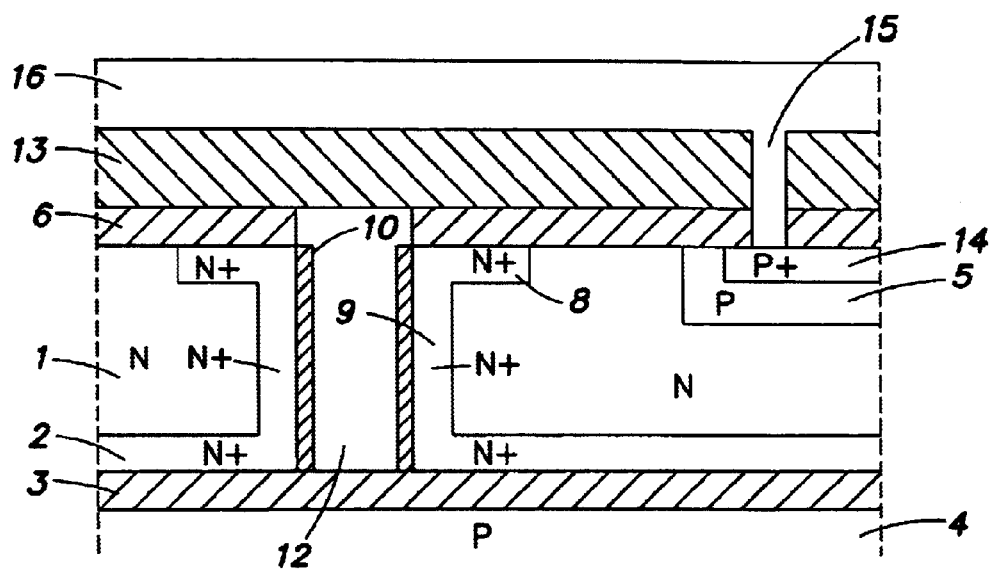
Figure 2:
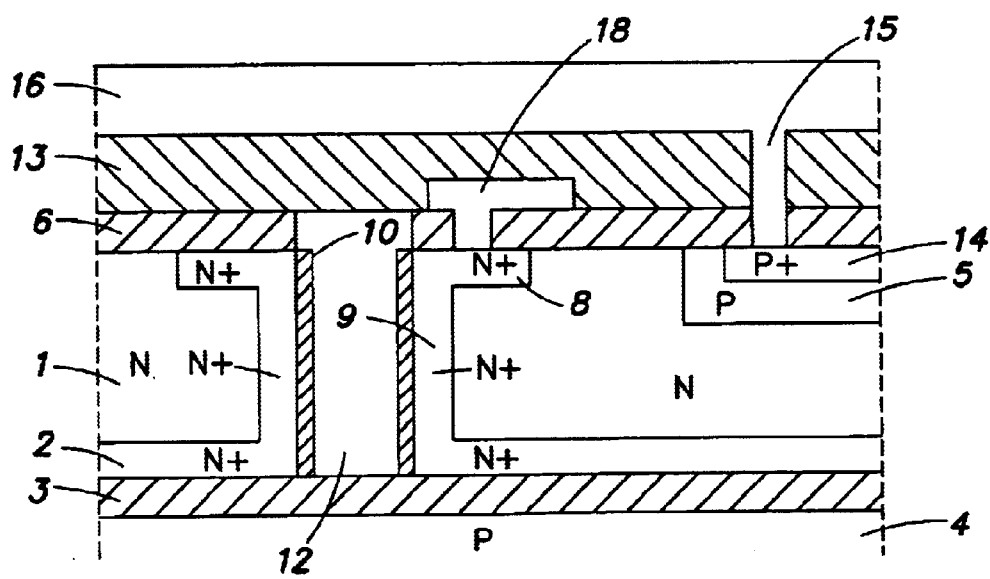
FIG. 2 illustrates, in a partial simplified cross-section view, an intermediary state of a discrete component formed according to another conventional method.
Figure 3A:
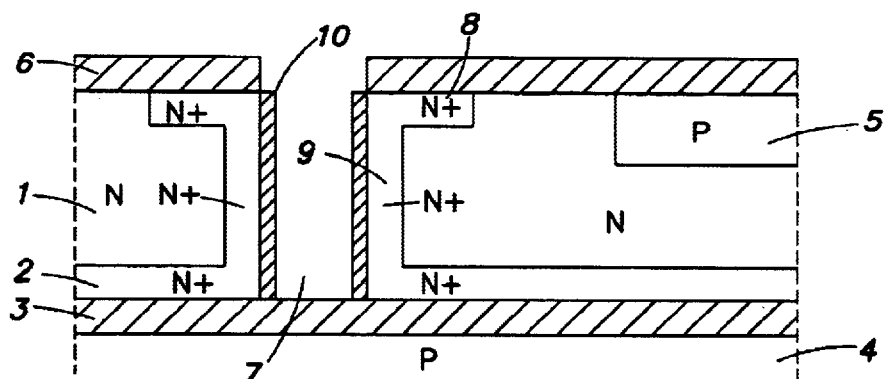
FIGS. 3A to 3C illustrate, in simplified partial cross-section views, different steps of the forming of a discrete component according to the present invention.

As illustrated in FIG. 3A, the present invention provides a manufacturing method using initial steps identical to those described in relation with FIGS. 1A and 1B.

Figure 3B:
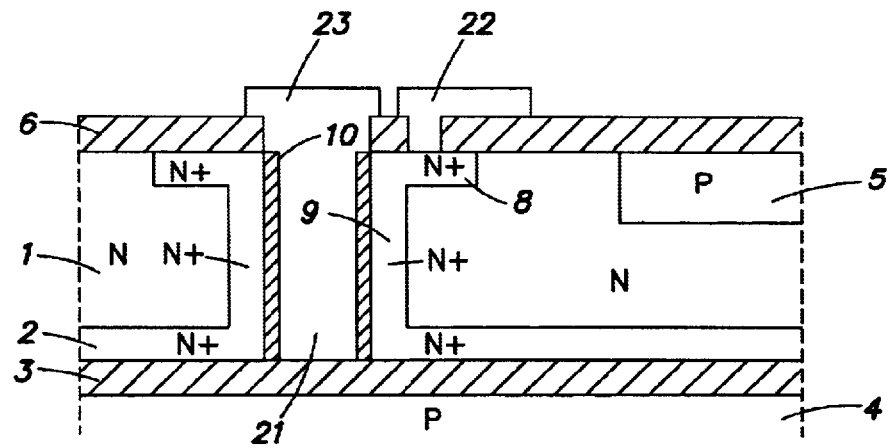

Then, as illustrated in FIG. 3B, the method according to the present invention continues with the opening of protection layer 6, to partially expose peripheral region 8. A conductive material, preferably heavily-doped N-type polysilicon (of the same conductivity type as region 8), which fills the insulating trench (7, FIG. 3A) and covers the entire structure, is then deposited. A chem-mech polishing or other may be performed to give the material a substantially planar upper surface. The portion of the material filling the trench forms a peripheral or lateral wall 21 separated from peripheral region 8 and vertical region 9 and from buried layer 2 by insulating layer 10. An etching is performed to form two distinct plates. A first plate 22 is in contact with peripheral region 8 and extends towards well 5, without reaching it, beyond the location above the limit between region 8 and substrate 1 to form a field plate. A second plate 23 contacts wall 21.

Figure 3C:
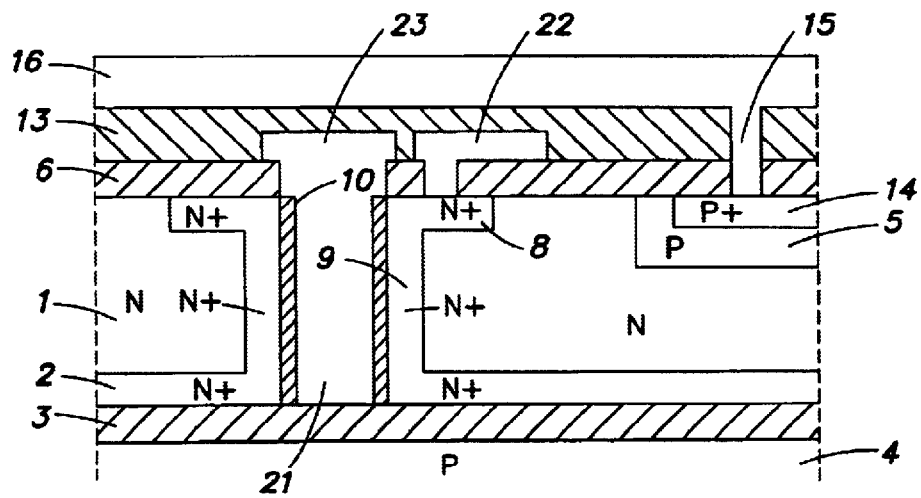

As illustrated in FIG. 3C, the forming of a discrete component according to the present invention ends with the forming in and around well 5 of specifically doped regions 14, with the deposition of a layer of a dielectric 13, and with the forming of contacts 15. The number, nature, and arrangement of such regions 14 and contacts 15 vary according to the component formed, for example, a thyristor, a bipolar PNP- or NPN-type transistor, or a diode. Contacts 15 enable connecting by means of metal tracks 16 the obtained component to other components or to power sources.

The forming of plates 22 and 23 from a same polysilicon deposition according to the present invention enables forming field plates in a same manufacturing step as the filling of the isolating trenches and thus simplifies the manufacturing process.

Of course, the present invention is likely to have various alterations, modifications, and improvements which will readily occur to those skilled in the art. In particular, it has been considered in the detailed example that each discrete component is separated from the next discrete component by the succession of a first insulating trench, of an unused area of substrate 1, and of another insulating trench. However, it is also possible to separate two discrete components with a single insulating trench. Then, the extent of plate 23 in contact with the trench filing is limited and a plate is formed in contact with the peripheral region of the next component. Further, it is also possible, in one case or the other, to only form the sole plate 22 contacting peripheral region 8. However, the simultaneous forming of additional plate 23 enables stabilizing the distribution of the equipotential surfaces close to peripheral region 8 without complicating the process.

Generally, the principles of the present invention are not limited to the examples of the foregoing description. Thus, those skilled in the art will know how to choose the materials used according to the considered technological process, respecting their conductive or insulating nature such as defined in the foregoing description. Those skilled in the art will for example know how to adapt the materials to the nature of the semiconductor substrate in which the component is formed. Indeed, the principles of the present invention are not limited to the forming of a discrete high-voltage component in a silicon-on-insulator substrate, but also apply to their forming in any semiconductor substrate on insulator. Similarly, it has been considered that the wells of the insulating trench were coated with a thermal silicon oxide layer (10). However, it could be replaced with a specifically-deposited layer of silicon oxide or any other appropriate insulator. Further, it has been considered in the foregoing description that the substrate, the peripheral region, or the buried layer were of conductivity type N. They could also be of complementary conductivity type P. In the case were the conductive material filling the insulating trench and forming the plate(s) according to the present invention is a semiconductor, it will be ascertained for it to be doped of the same conductivity type as the peripheral region. Further, in the described embodiment, a portion (well 5) of the regions necessary to form the component has been formed in the substrate before forming of the periphery and another portion (regions 14) has been formed after. However, any appropriate region may be formed at any step of the forming of the periphery according to the present invention.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A discrete high-voltage component formed in a portion of a semiconductor substrate of a first conductivity type on an insulator delimited by a lateral wall separated by an insulating layer from a peripheral region internal to said portion and heavily doped of the first conductivity type, and including a conductive plate in electric contact with the peripheral region, the plate resting on a layer of protection of the substrate surface, and extending above said peripheral region towards the inside of said portion with respect to the wall beyond the location above the limit between the peripheral region and the substrate, said plate being formed of the same conductive material as said lateral wall.

2. The component of claim 1, further including an additional plate continuing the lateral wall, the additional plate being formed of the same conductive material as the wall and being distinct from the plate in contact with the peripheral region, the upper surfaces of the two plates being coplanar.

3. The component of claim 1, wherein the conductive material is a heavily-doped semiconductor of the first conductivity type.

* * * * *

UNITED STATES PATENT AND TRADEMARK OFFICE
CERTIFICATE OF CORRECTION

PATENT NO. : 6,677,657 B2
DATED : January 13, 2004
INVENTOR(S) : Pascal Gardes

It is certified that error appears in the above-identified patent and that said Letters Patent is hereby corrected as shown below:

<u>Title page,</u>
Item [73], should read:
-- [73] Assignee: STMicroelectronics S.A., Montrouge (FR) --

Signed and Sealed this

Fourth Day of May, 2004

JON W. DUDAS
*Acting Director of the United States Patent and Trademark Office*